(12) United States Patent
Shen et al.

(10) Patent No.: US 7,474,885 B2
(45) Date of Patent: *Jan. 6, 2009

(54) PASSIVE SUBHARMONIC MIXER

(75) Inventors: David H. Shen, San Jose, CA (US); Ann P. Shen, Saratoga, CA (US)

(73) Assignee: NanoAmp Solutions, Inc. (Cayman), Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/764,052

(22) Filed: Jun. 15, 2007

(65) Prior Publication Data

US 2007/0243847 A1    Oct. 18, 2007

Related U.S. Application Data

(63) Continuation of application No. 10/729,638, filed on Dec. 5, 2003, now Pat. No. 7,248,850.

(60) Provisional application No. 60/431,979, filed on Dec. 10, 2002.

(51) Int. Cl.
*H04B 1/26* (2006.01)
(52) U.S. Cl. ...................... 455/324; 455/333
(58) Field of Classification Search ................ 455/313, 455/315, 318–319, 323–324, 326, 333; 327/113
See application file for complete search history.

(56) References Cited

U.S. PATENT DOCUMENTS

| | | | |
|---|---|---|---|
| 5,532,637 A | 7/1996 | Khoury et al. | |
| 5,630,228 A * | 5/1997 | Mittel | 455/326 |
| 5,999,804 A | 12/1999 | Forgues | |
| 6,370,372 B1 | 4/2002 | Molnar et al. | |
| 6,639,447 B2 | 10/2003 | Manku et al. | |
| 6,697,613 B1 | 2/2004 | Domino et al. | |
| 6,999,747 B2 | 2/2006 | Su | |
| 7,248,850 B2 * | 7/2007 | Shen | 455/318 |

OTHER PUBLICATIONS

Liwei Sheng, Jonathan C. Jensen, and Lawrence E. Larson, "A Wide-Bandwidth Si/SiGe HBT Direct Conversion Sub-Harmonic Mixer/Downconverter", IEEE Journal of Solid-State Circuits, vol. 36, No. 9, Sep. 2000, pp. 1329-1337.

Jan Crols and Michel S. J. Steyaert, "A 1.5 GHz Highly Linear CMOS Downconversion Mixer", IEEE Journal of Solid-State Circuits, vol. 30, No. 7, Jul. 1995, pp. 736-742.

* cited by examiner

*Primary Examiner*—Nguyen Vo
(74) *Attorney, Agent, or Firm*—Fish & Richardson P.C.

(57) ABSTRACT

Embodiments feature a circuit that includes a first set of differential switches to generate a first mixer output. The first set includes source terminals, a differential input terminal, gate terminals, and first mixer output terminals. For the first set, the source terminals are coupled to the differential input terminal and the gate terminals are coupled to a first differential oscillator input. The circuit includes a second set of differential switches to generate a second mixer output. The second set of differential switches has source terminals, gate terminals, and second mixer output terminals. For the second set of differential switches, the source terminals of the second set of differential switches are coupled to the first mixer output terminals to receive the first mixer output and the gate terminals of the second set of differential switches are coupled to a second differential oscillator input. The second mixer output terminals couple a filter.

24 Claims, 6 Drawing Sheets

PASSIVE SUBHARMONIC MIXER

CROSS-REFERENCE TO RELATED APPLICATIONS

This application is a continuation application of, and claims priority to, U.S. patent application Ser. No. 10/729,638, entitled Passive Subharmonic Mixer Design, to inventor David H. Shen, which was filed on Dec. 5, 2003, now U.S. Pat. No. 7,248,850. U.S. patent application Ser. No. 10/729,638 claims priority to U.S. Provisional Application No. 60/431,979, entitled Passive Subharmonic Mixer Design, to inventor David H. Shen, which was filed on Dec. 10, 2002. The disclosure of the above applications are incorporated herein by reference in their entirety.

TECHNICAL FIELD

The present invention relates to techniques for transceivers, circuitry, and methods for the reception and processing of communication signals.

BACKGROUND

At the present time, the vast majority of RF communication receivers are of the superheterodyne type. This type of receiver uses one or more IF (intermediate frequency) stages for filtering and amplifying signals at a fixed frequency within an IF chain. This radio architecture has the advantage that fixed filters may be used in the local oscillator (LO) chain. In order for the receiver to be useable over multiple bands, its typical architecture is implemented as the single-band receiver shown in FIG. 1. An RF signal arriving at an antenna 11 passes through a band-select RF filter 13, a low noise amplifier (LNA) 15, and into an image filter 17, which produces a band-limited RF signal. This band-limited RF signal then enters the first mixer 19, which translates the RF signal down to an intermediate frequency by mixing it with the signal produced by the first LO 21. The undesired mixer products in the IF signal are rejected by an IF filter 23. The filtered IF signal then enters an IF amplifier stage 25, after which the outputs feeds into the second mixer 27 that translates it down to yet another intermediate frequency by mixing it with the signal produced by a second LO 28. The signal is then sent to the baseband for processing. Tuning into a particular channel within the band-limited RF signal is accomplished by varying the frequency of each LO 21 and 28.

In order to reduce size, power consumption, and cost, it may be advantageous to integrate the electronic components of radio receiver and transmitter to reduce the number of filters and mixers. The superheterodyne design, however, requires high quality, narrowband IF bandpass filters that are typically implemented off-chip. These filtering components impose a lower limit to the size, materials cost, assembly cost, and power consumption of receivers and transmitters that are built using the superheterodyne design. Moreover, the necessity for mixer and local oscillator circuits operating at high frequencies contributes greatly to the power consumption and general complexity of the superheterodyne receiver. In particular, the high-frequency analog mixers require a large amount of power to maintain linear operation. Although many variations of the superheterodyne design exist, they all share the limitations of the particular design just described.

There may be attempts to design radio receivers that permit the integration of more components onto a single chip because of the growing demand for portable communications. Recent advances in semiconductor processing of inductors can allow more and more of these filters to be implemented on-chip.

A second receiver design is the direct-conversion, or zero-IF, receiver shown in FIG. 2. An antenna 57 couples a RF signal through a first bandpass RF filter 59 into an LNA 61. The signal then proceeds through a second RF filter 63, yielding a band-limited RF signal, which then enters a mixer 65 and mixes with an LO frequency produced by an LO 67. Up to this point, the direct-conversion receiver design is essentially the same as the previous receiver design. Unlike the previous designs, however, the LO frequency is set to the carrier frequency of the RF channel of interest. The resulting mixer product is a zero-frequency IF signal—a modulated signal at baseband frequency. The mixer output 67 is coupled into a lowpass analog filter 69 before proceeding into baseband information signal for use by the remainder of the communications system. In either case, tuning can be accomplished by varying the frequency of LO 67, thereby converting different RF channels to zero-frequency IF signals.

Because the direct-conversion receiver design can produce a zero-frequency IF signal, its filter requirements are greatly simplified—no external IF filter components are needed since the zero-IF signal is an audio frequency signal that can be filtered by a low-quality lowpass filter. This allows the receiver to be integrated in a standard silicon process from the mixer 65 stage onwards, making the direct-conversion receiver design potentially attractive for portable applications.

The direct-conversion design, however, has several problems, some of which are quite serious. As with the other designs described above, the RF and image filters required in the direct-conversion design must be high-quality narrow-band filters that must remain off-chip. Moreover, this design requires the use of high-frequency mixer and LO circuits that require large amounts of power. Additionally, radiated power from LO 67 can couple into antenna 57, producing a DC offset at the output of mixer 65. This DC offset can be much greater than the desired zero-IF signal, making signal reception difficult. Radiated power from LO 67 can also affect other nearby direct-conversion receivers tuned to the same radio frequency.

The active subharmonic mixer can be a circuit to reduce the local oscillator self-mixing and radiation problems in a direct conversion (or low IF) receiver by using multiple phases of a subharmonic frequency in multi-stack double-balanced active mixer topology. FIG. 3 is block diagram of a conventional subharmonic mixer. In this mixer, RF inputs 71 and 72 are converted to currents by transistors 79 and 80. The in-phase local oscillator signals 73 and 74 drive the first stage of current commutators of transistors 81-84, and the quadrature local oscillator signals 75 and 76 drive the second stage of current commutators 85-88. The resulting currents are converted to output voltages 77 and 78 by resistors 89 and 90. These techniques rely on active mixers that do not scale well with lower supply voltages, have significant non-linearity, have high power dissipation, and can not be effectively implemented in MOS technologies.

SUMMARY

The present invention achieves the above objectives and advantages by providing new designs and techniques for implementing a subharmonic mixer in a passive configuration. These designs and techniques use multiple phases of the local oscillator to drive multiple stages of switches that create a harmonic mixing of the input signal. In some implementations, the input signal may be an RF input signal.

In general, in one aspect, embodiments of the invention feature a circuit that includes a first set of differential switches to generate a first mixer output. The first set of differential switches has source terminals, a differential input terminal, gate terminals, and first mixer output terminals. For the first set of differential switches, the source terminals of the first set of differential switches are coupled to the differential input terminal and the gate terminals of the first set of differential switches are coupled to a first differential oscillator input. The circuit includes a second set of differential switches to generate a second mixer output. The second set of differential switches has source terminals, gate terminals, and second mixer output terminals. For the second set of differential switches, the source terminals of the second set of differential switches are coupled to the first mixer output terminals to receive the first mixer output and the gate terminals of the second set of differential switches are coupled to a second differential oscillator input. The circuit also has a filter coupled between the second mixer output terminals.

These and other embodiments can optionally include one or more of the following features. The circuit can be configured for mixing to a second mixer output frequency that is different from a first differential oscillator input frequency or a second differential oscillator input frequency. The circuit can be configured for mixing a second mixer output frequency that is at least two times the first differential oscillator input frequency or the second differential oscillator input frequency. The filter can be a high-frequency filtering capacitor, and the first and second sets of differential switches can be MOSFET switches.

In some embodiments, the circuit can include a passive mixer. The circuit can optionally include any of a direct conversion receiver, a radio frequency (RF) receiver, or a low intermediate frequency (IF) receiver.

In some embodiments, the first differential oscillator input can be independent and distinct from the second differential oscillator input. For example, the first differential oscillator input can be phase-shifted from the second differential oscillator input. The first differential oscillator input can be an in-phase oscillator input and the second differential oscillator input can be a quadrature-phase oscillator input. Alternatively, the first differential oscillator input can be a quadrature-phase oscillator input and the second differential oscillator input can be an in-phase oscillator input. The first differential oscillator input can include a first differential oscillator input frequency that is different from a second differential oscillator input frequency of the second differential oscillator input.

In some embodiments, the differential input terminal can optionally be configured for an RF differential input terminal. The first set of differential switches and the second set of differential switches can be transmission-gate transistors.

In other embodiments, the circuit can optionally include a third set of differential switches to generate a third mixer output, the third set of differential switches having source terminals, gate terminals, and third mixer output terminals, in which source terminals of the third set of differential switches can be coupled to the second mixer output terminals. The circuit can be configured to produce a mixing of at least three times an oscillator frequency.

In general, in another aspect, embodiments of the invention feature a mixing circuit that includes a first set of differential switches for mixing a first mixing signal, in which the first set of differential switches includes a first set of source terminals, a first set of gate terminals, and a first set of drain terminals.

The mixing circuit also includes a second set of differential switches for mixing a second mixing signal, in which the second set of differential switches includes a second set of source terminals, a second set of gate terminals, and a second set of drain terminals. The first set of source terminals are differentially coupled to the second set of drain terminals. A first differential oscillator input is coupled to the first set of gate terminals, and a second differential oscillator input is coupled to the second set of gate terminals. In a forward signal mode, the first set of source terminals are configured for a differential input and the second set of drain terminals are configured for a differential output. In a reverse signal mode, the first set of source terminals are configured for a differential output and the second set of drain terminals are configured for a differential input.

Particular embodiments of the invention can be implemented to realize one or more of the following advantages. The first differential oscillator input can be phase-shifted from the second differential oscillator input. The first differential oscillator input can be a local oscillator frequency that differs from the second differential oscillator input. In the forward signal mode, the mixing circuit can be configured to downconvert a differential input signal frequency to produce a differential output signal having a lower frequency than the differential input signal. In the reverse signal mode, the mixing circuit can be configured to upconvert a differential input signal frequency to produce a differential output signal having a higher frequency than the differential input signal. In some embodiments, the first set of differential switches and the second set of differential switches can include transmission-gate transistors.

In general, in another aspect, embodiments of the invention feature a mixer that includes a first set of differential switches with a first and second complementary pair of switches, a second set of differential switches with a first and second complementary pair of switches, and a capacitor.

The first set of differential switches include the first complementary pair of switches, in which source terminals of the first complementary pair of switches are configured to be coupled to a first input terminal. A gate terminal of a first switch in the first complementary pair of switches is configured to be coupled to a first differential in-phase oscillator input terminal. A gate terminal of a second switch in the first complementary pair of switches is configured to be coupled to a second differential in-phase oscillator input terminal. A drain terminal of the first switch is coupled to source terminals in a first complementary pair of switches in a second set of differential switches. A drain terminal of the second switch is coupled to source terminals in a second complementary pair of switches in the second set of differential switches.

The first set of differential switches include the second complementary pair of switches, in which source terminals of the second complementary pair of switches are configured to be coupled to a second input terminal. A gate terminal of a first switch in the second complementary pair of switches is configured to be coupled to a second differential in-phase oscillator input terminal. A gate terminal of a second switch in the second complementary pair of switches is configured to be coupled to a first differential in-phase oscillator input terminal. A drain terminal of the first switch is coupled to source terminals in the first complementary pair of switches in the second set of differential switches. A drain terminal of the second switch is coupled to source terminals in the second complementary pair of switches in the second set of differential switches. The first and second input terminals are configured for a differential input signal.

The second set of differential switches include the first complementary pair of switches, in which a gate terminal of the first switch in the first complementary pair of switches in the second set of differential switches is configured to be coupled to a first differential quadrature-phase oscillator input terminal. A gate terminal of a second switch in the first complementary pair of switches is configured to be coupled to a second differential quadrature-phase oscillator input terminal. A drain of the first switch in the first complementary pair of switches in the second set of differential switches is coupled to a first terminal of the capacitor. A drain of the second switch in the first complementary pair of switches in the second set of differential switches is coupled to a second terminal of the capacitor.

The second set of differential switches include the second complementary pair of switches, in which a gate terminal of a first switch in the second complementary pair of switches in the second set of differential switches is configured to be coupled to a second differential quadrature-phase oscillator input terminal. A gate terminal of a second switch in the second complementary pair of switches is configured to be coupled to a first differential quadrature-phase oscillator input terminal. A drain of the first switch in the second complementary pair of switches in the second set of differential switches is coupled to the first terminal of the capacitor. A drain of the second switch in the second complementary pair of switches in the second set of differential switches is coupled to the second terminal of the capacitor, where the capacitor is included in mixer.

Particular embodiments of the invention can be implemented to realize one or more of the following advantages. The disclosed design can provide a passive subharmonic mixer design that can reduce local oscillator radiation, operate at low supply voltages, have low-power dissipation, achieve high linearity, and accommodate large signal swings. The new mixer can be used in a direct conversion or low IF receiver architecture to increase integration and decrease power consumption without the operational problems associated with previous or conventional receiver designs. The disclosed design can provide at least an equivalent or better performance to the traditional multi-band superheterodyne receiver, for example, as shown in FIG. 1. The mixer design can be a reversible mixer design that can downconvert and/or upconvert signal frequencies.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings can indicate like elements.

DETAILED DESCRIPTION

Figure 1:
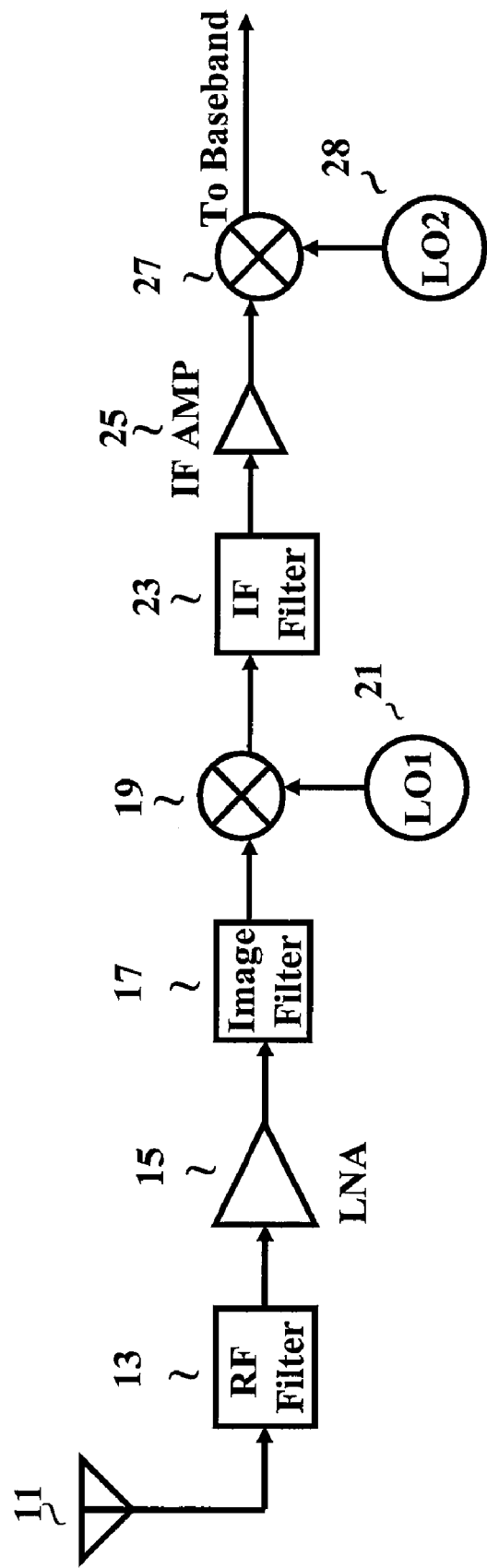
FIG. 1 is a block diagram of a conventional dual-band superheterodyne receiver.
Figure 2:
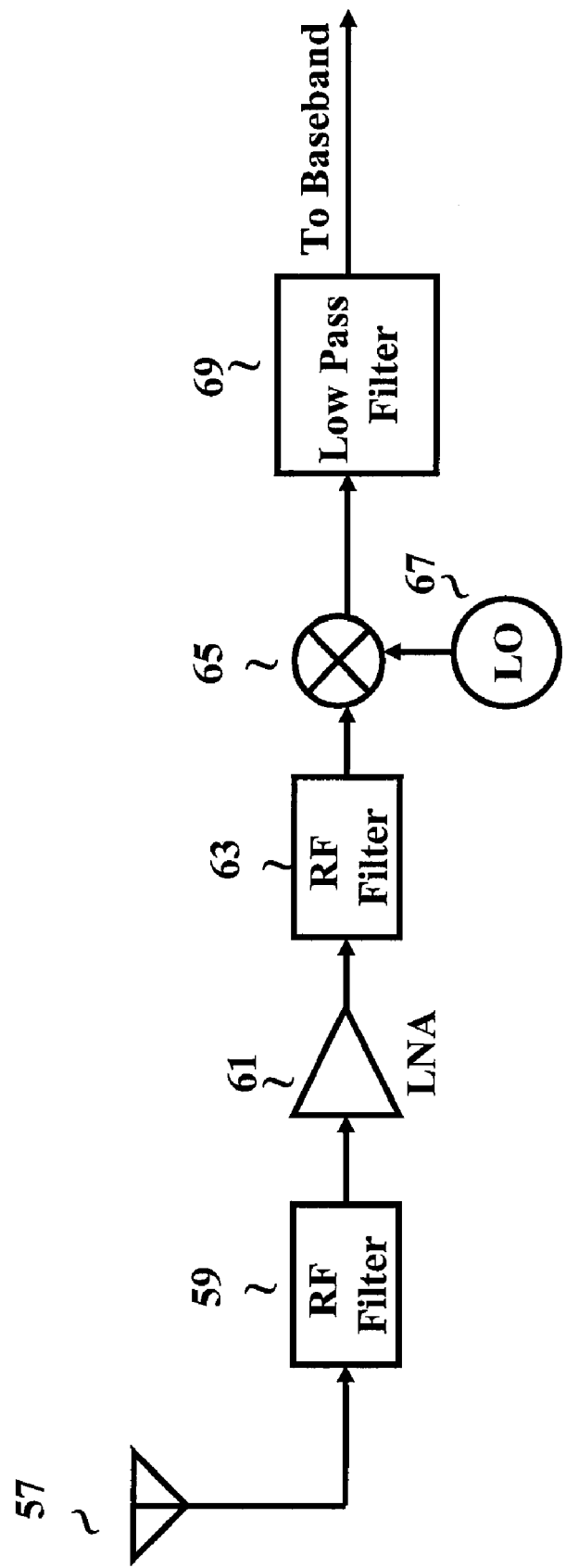
FIG. 2 is a block diagram of a conventional direct-conversion receiver.
Figure 3:
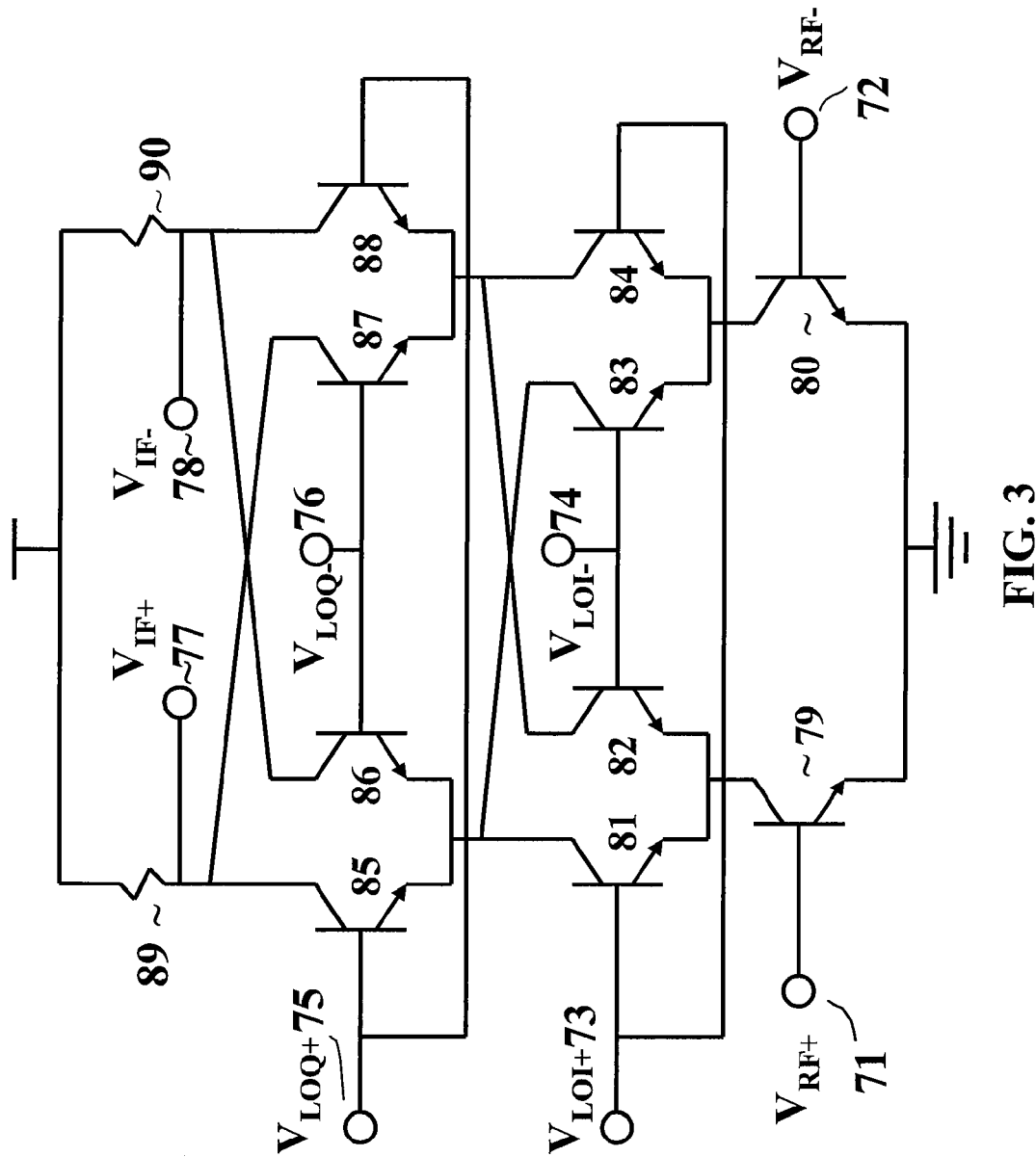
FIG. 3 is a schematic of a conventional active sub-harmonic mixer.
Figure 4:
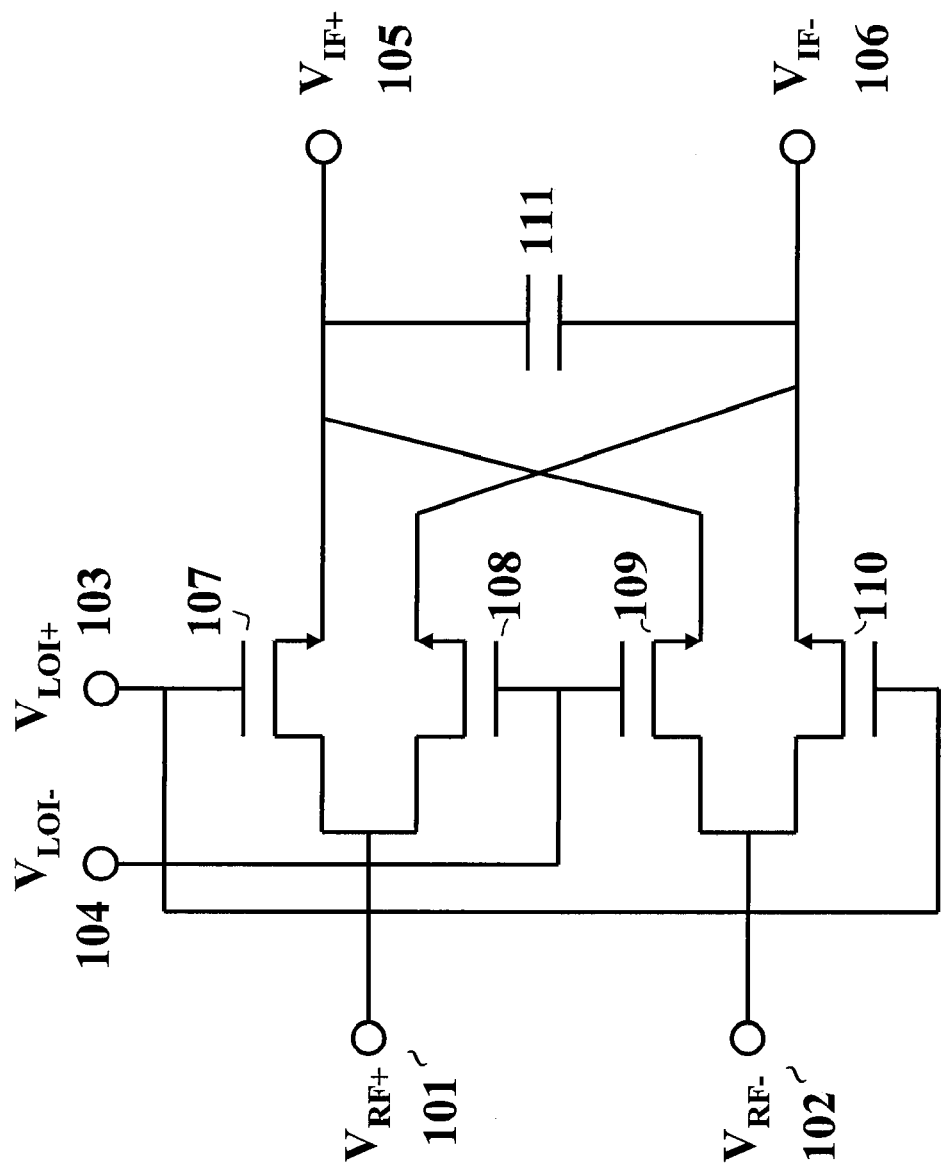
FIG. 4 is a schematic of a conventional passive mixer.

Of the embodiments of the invention described, it will be understood that various modifications may be made without departing from the spirit and scope of the invention. For example, FIG. 4 is a block diagram of a conventional passive mixer. The mixer includes RF inputs 101 and 102 that are connected to four MOS switches 107-110 with gates driven by the local oscillator positive and negative differential phases 103 and 104. The load capacitor 111 is used to filter the high-frequency noise of the system at the output 105 and 106. The local oscillator signal 103 and 104 inverts the phase of the RF input 101 and 102 on every half cycle, thus producing the mixing function between the RF input and the local oscillator input. Because the switches are passive components and do not dissipate power, the passive mixer has advantages compared to an active mixer with reduce power and improved linearity.

Figure 5:
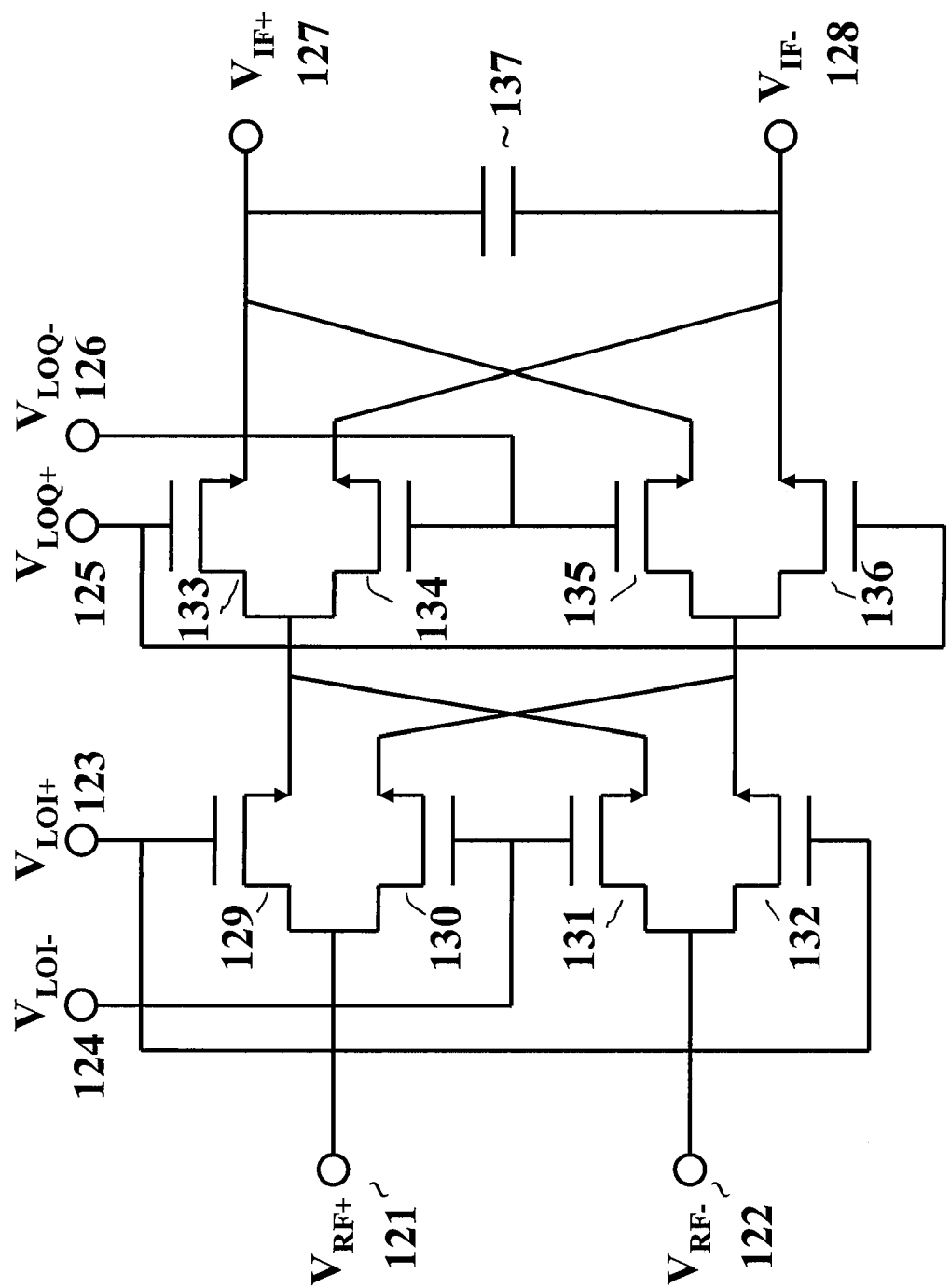
FIG. 5 is a schematic of one embodiment of the mixer.

FIG. 5 is a schematic of an embodiment of a passive subharmonic mixer constructed in accordance with the principles of the present invention. This embodiment is for a local oscillator running at one half the mixing frequency, and thus requires differential in-phase 123 and 124 and quadrature-phase 125 and 126 local oscillator signal inputs. The RF input is connected to the source terminals 121 and 122 of the first set of MOS switches 129-132. The gates of the MOS switches are connected to the positive and differential phases of the in-phase local oscillator signals 123 and 124. The drains terminals of the MOS switches 129-132 are connected to a second set of MOS switches 133-136, whose gates are connected to the quadrature-phase local oscillator signals 125 and 126. The combined mixing action of the two levels of MOS switches creates an effective mixing by $2*f_{LO}$, where $f_{LO}$ is the frequency of the local oscillator. By swapping the in-phase 123 and 124 and quadrature-phase 125 and 126 local oscillator signals, the mixer performs a 90 degrees phase shifted mixing function. Capacitor 137 is the load at 127-128 and a filter for high frequency signals.

Other embodiments of FIG. 5 can use three levels of MOS switches in series to produce a mixing by $3*f_{LO}$ by using three differential phases of the local oscillator signal. Additional levels of switches in series can provide for additional amounts of frequency mixing. For example, N stages of switches in series can modify the mixing by $N*f_{LO}$ when using N phases of the local oscillator signal.

In another embodiment, the mixer embodiment of FIG. 5 can be a reversible mixer. For example, the input and output terminals of FIG. 5 can be reversed such that the input signal driven at the capacitor load 137 at terminals 127 and 128, and the output signal is produced at terminals 121 and 122.

In some embodiments, the input and output terminals of the mixer can be connected to operate the mixer in one of two modes: a forward signal mode and a reverse signal mode. In the forward signal mode, the mixer is driven with an input signal at input terminals 121 and 122 and the output terminals 127 and 128 are at the capacitor load 137. In the forward signal mode, the mixer can downconvert a high-frequency signal to a lower frequency signal. For example, for a FM radio application, an input FM signal in the 88 MHz to 108 MHz range can be downconverted to an intermediate frequency (IM) signal of 10 MHz.

In the reverse signal mode, the input terminals are connected as output terminals, while the output terminals are connected as input terminals. For example, in the reverse signal mode, the mixer is driven with an input signal at the load capacitor 137 at terminals 127 and 128 that couple to the capacitor 137, and the output signal is produced at terminals 121 and 122. The symmetric nature of the circuit allows the mixer to upconvert a low-frequency signal to a higher frequency signal in the reverse signal mode. In a cellular phone application, for example, employing the mixer in the reverse signal mode can facilitate an input baseband signal with 100 kHz bandwidth to be upconverted to a 935 MHz RF frequency in a cellular phone direct upconversion system.

Figure 6:
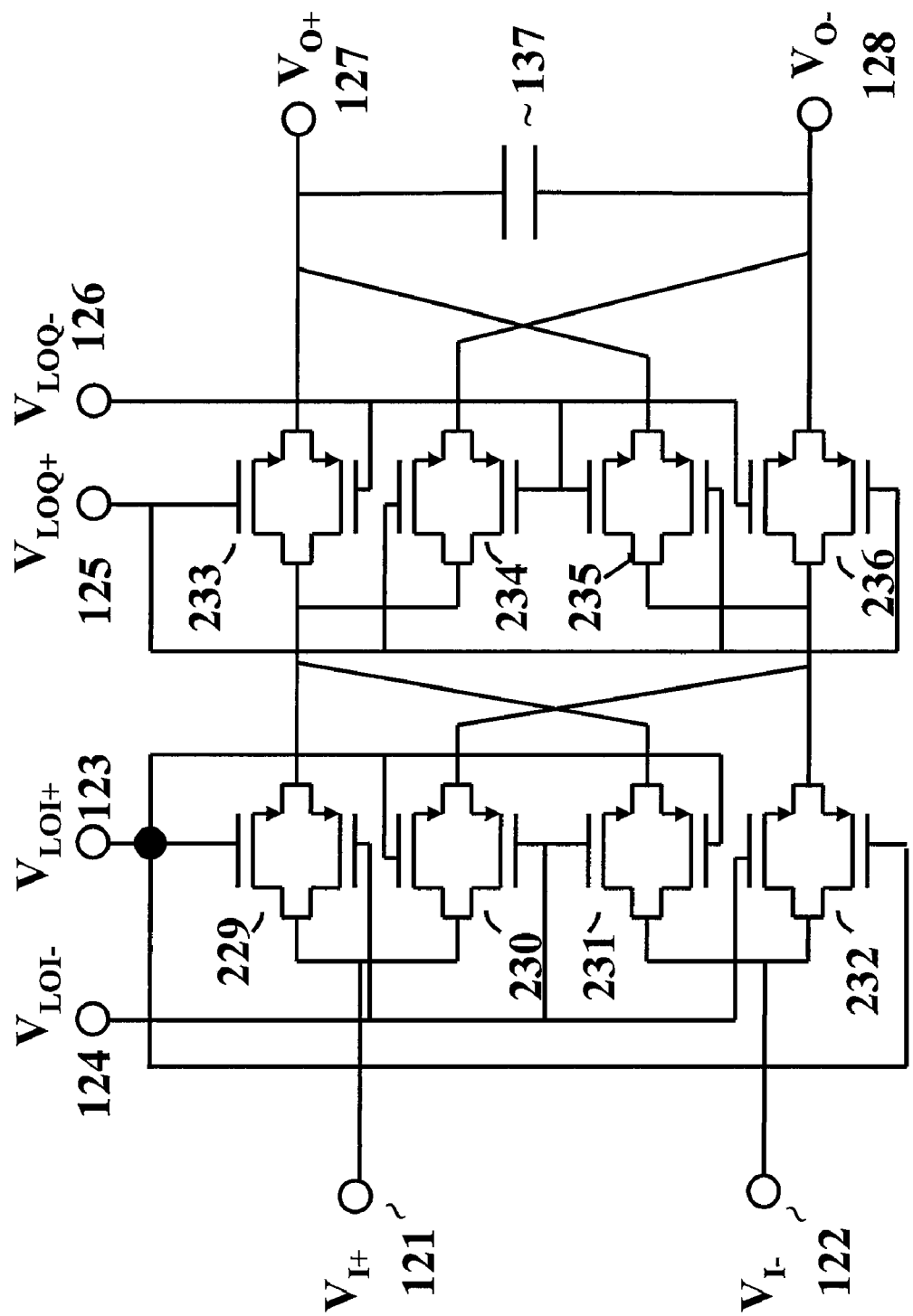
FIG. 6 is a schematic of another embodiment of the mixer.

FIG. 6 is an example embodiment of the mixer of FIG. 5 that shows each device 129-136 in FIG. 5 as a transmission gate switch, where the devices 229-236 for the switches are NMOS and PMOS devices. The mixer embodiment shown in FIG. 6 can have the reversible signal characteristics as described with respect to the mixer embodiment of FIG. 5. The transmission gate switches can help the mixer to take advantage of larger voltage swings in the input and output. For example, the transmission gate switches can provide even higher linearity and dynamic range than comparable single-device switches. In another benefit, the symmetrical clock drive on the transmission gate switches can provide for cancellation of capacitive feedthrough and error from the clock signals on the gates of the NMOS and PMOS devices.

The frequency ranges for the mixer embodiments are not limited to the frequency range of RF signals, but may include other types of signals, such as IF signals, baseband signals, audio signals, video signals, and other types of communication signals. Other modifications are within the scope of the following claims.

What is claimed is:

1. A circuit comprising:
    a first set of differential switches to generate a first mixer output, the first set of differential switches having source terminals, a differential input terminal, gate terminals, and first mixer output terminals,
    wherein for the first set of differential switches, the source terminals of the first set of differential switches are coupled to the differential input terminal and the gate terminals of the first set of differential switches are coupled to a first differential oscillator input;
    a second set of differential switches to generate a second mixer output, the second set of differential switches having source terminals, gate terminals, and second mixer output terminals,
    wherein for the second set of differential switches, the source terminals of the second set of differential switches are coupled to the first mixer output terminals to receive the first mixer output and the gate terminals of the second set of differential switches are coupled to a second differential oscillator input; and
    a filter coupled between the second mixer output terminals.

2. The circuit of claim 1, wherein the circuit is configured for mixing to a second mixer output frequency that is different from a first differential oscillator input frequency or a second differential oscillator input frequency.

3. The circuit of claim 2, wherein the circuit is configured for mixing a second mixer output frequency that is at least two times the first differential oscillator input frequency or the second differential oscillator input frequency.

4. The circuit of claim 1, wherein the filter comprises a high-frequency filtering capacitor.

5. The circuit of claim 1, wherein the first and second sets of differential switches comprise MOSFET switches.

6. The circuit of claim 1, wherein the circuit comprises a passive mixer.

7. The circuit of claim 1, wherein the circuit further comprises any of a direct conversion receiver, a radio frequency (RF) receiver, or a low intermediate frequency (IF) receiver.

8. The circuit of claim 1, wherein the first differential oscillator input is independent from the second differential oscillator input.

9. The circuit of claim 8, wherein the first differential oscillator input comprises a first differential oscillator input frequency that is different from a second differential oscillator input frequency of the second differential oscillator input.

10. The circuit of claim 1, wherein the differential input terminal is configured for an RF differential input terminal.

11. The circuit of claim 1, wherein the first set of differential switches and the second set of differential switches comprise transmission-gate transistors.

12. The circuit of claim 1, further comprising a third set of differential switches to generate a third mixer output, the third set of differential switches having source terminals, gate terminals, and third mixer output terminals, wherein source terminals of the third set of differential switches are coupled to the second mixer output terminals.

13. The circuit of claim 12, wherein the circuit is configured to produce a frequency of at least three times an oscillator frequency.

14. The circuit of claim 1, wherein the first differential oscillator input is dependent upon a relation to the second differential oscillator input.

15. The circuit of claim 14, wherein the relation comprises the first differential oscillator input being phase-shifted from the second differential oscillator input.

16. The circuit of claim 15, wherein the first differential oscillator input comprises an in-phase oscillator input and the second differential oscillator input comprises a quadrature-phase oscillator input.

17. The circuit of claim 15, wherein the first differential oscillator input comprises a quadrature-phase oscillator input and the second differential oscillator input comprises an in-phase oscillator input.

18. A mixing circuit comprising:
    a first set of differential switches for mixing a first mixing signal, the first set of differential switches having first set source terminals, first set gate terminals, and first set drain terminals;
    a second set of differential switches for mixing a second mixing signal, the second set of differential switches having second set source terminals, second set gate terminals, and second set drain terminals, wherein the first set source terminals are differentially coupled to the second set drain terminals;
    a first differential oscillator input coupled to the first set gate terminals; and
    a second differential oscillator input coupled to the second set gate terminals,
    wherein in a forward signal mode, the first set source terminals are configured for a differential input and the second set drain terminals are configured for a differential output, and
    wherein in a reverse signal mode, the first set source terminals are configured for a differential output and the second set drain terminals are configured for a differential input.

19. The mixing circuit of claim 18, wherein the first differential oscillator input is phase-shifted from the second differential oscillator input.

20. The mixing circuit of claim 18, wherein the first differential oscillator input comprises a local oscillator frequency that differs from the second differential oscillator input.

21. The mixing circuit of claim 18, wherein in the forward signal mode, the mixing circuit is configured to downconvert a differential input signal frequency to produce a differential output signal having a lower frequency than the differential input signal.

22. The mixing circuit of claim 18, wherein in the reverse signal mode, the mixing circuit is configured to upconvert a differential input signal frequency to produce a differential output signal having a higher frequency than the differential input signal.

23. The mixing circuit of claim 18, wherein the first set of differential switches and the second set of differential switches comprise transmission-gate transistors.

24. A mixer comprising:
a first set of differential switches, comprising:
a first complementary pair of switches, where source terminals of the first complementary pair of switches are configured to be coupled to a first input terminal, a gate terminal of a first switch in the first complementary pair of switches is configured to be coupled to a first differential in-phase oscillator input terminal, a gate terminal of a second switch in the first complementary pair of switches is configured to be coupled to a second differential in-phase oscillator input terminal, a drain of the first switch is coupled to source terminals in a first complementary pair of switches in a second set of differential switches, and a drain of the second switch is coupled to source terminals in a second complementary pair of switches in the second set of differential switches; and
a second complementary pair of switches, where source terminals of the second complementary pair of switches are configured to be coupled to a second input terminal, a gate terminal of a first switch in the second complementary pair of switches is configured to be coupled to a second differential in-phase oscillator input terminal, a gate terminal of a second switch in the second complementary pair of switches is configured to be coupled to a first differential in-phase oscillator input terminal, a drain of the first switch is coupled to source terminals in the first complementary pair of switches in the second set of differential switches, and a drain of the second switch is coupled to source terminals in the second complementary pair of switches in the second set of differential switches, wherein the first and second input terminals are configured for a differential input signal;
the second set of differential switches, comprising:
the first complementary pair of switches, where a gate terminal of the first switch in the first complementary pair of switches in the second set of differential switches is configured to be coupled to a first differential quadrature-phase oscillator input terminal, a gate terminal of a second switch in the first complementary pair of switches is configured to be coupled to a second differential quadrature-phase oscillator input terminal, a drain of the first switch in the first complementary pair of switches in the second set of differential switches is coupled to a first terminal of a capacitor, and a drain of the second switch in the first complementary pair of switches in the second set of differential switches is coupled to a second terminal of the capacitor; and
a second complementary pair of switches, where a gate terminal of a first switch in the second complementary pair of switches in the second set of differential switches is configured to be coupled to a second differential quadrature-phase oscillator input terminal, a gate terminal of a second switch in the second complementary pair of switches is configured to be coupled to a first differential quadrature-phase oscillator input terminal, a drain of the first switch in the second complementary pair of switches in the second set of differential switches is coupled to the first terminal of the capacitor, and a drain of the second switch in the second complementary pair of switches in the second set of differential switches is coupled to the second terminal of the capacitor; and
the capacitor.

* * * * *